(12) United States Patent
Choi et al.

(10) Patent No.: US 8,564,102 B2
(45) Date of Patent: Oct. 22, 2013

(54) SEMICONDUCTOR DEVICE HAVING THROUGH SILICON VIA (TSV)

(75) Inventors: Ju-il Choi, Suwon-si (KR); Jae-hyun Phee, Incheon (KR); Kyu-ha Lee, Yongin-si (KR); Ho-jin Lee, Seoul (KR); Son-kwan Hwang, Suwon-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/108,231

(22) Filed: May 16, 2011

(65) Prior Publication Data

US 2011/0284936 A1 Nov. 24, 2011

(30) Foreign Application Priority Data

May 18, 2010 (KR) .................. 10-2010-0046587

(51) Int. Cl.
*H01L 29/40* (2006.01)
*H01L 23/48* (2006.01)
*H01L 23/52* (2006.01)

(52) U.S. Cl.
USPC ........... 257/621; 257/741; 257/758; 257/774; 257/E23.01; 257/E29.242

(58) Field of Classification Search
None
See application file for complete search history.

(56) References Cited

U.S. PATENT DOCUMENTS

| | | | |
|---|---|---|---|
| 2005/0189653 A1* | 9/2005 | Tao et al. | 257/758 |
| 2006/0216930 A1* | 9/2006 | Feng et al. | 438/637 |
| 2008/0261392 A1 | 10/2008 | Trezza | |
| 2009/0297091 A1* | 12/2009 | Assefa et al. | 385/14 |
| 2009/0305502 A1* | 12/2009 | Lee et al. | 438/667 |
| 2010/0109161 A1* | 5/2010 | Schuehrer et al. | 257/762 |
| 2010/0144118 A1* | 6/2010 | Yang et al. | 438/459 |
| 2010/0171226 A1* | 7/2010 | West et al. | 257/774 |
| 2011/0031581 A1* | 2/2011 | West | 257/508 |
| 2011/0193241 A1* | 8/2011 | Yen et al. | 257/774 |

FOREIGN PATENT DOCUMENTS

| | | |
|---|---|---|
| JP | 2009-218302 | 9/2009 |
| KR | 10-2008-0063613 | 7/2008 |

* cited by examiner

*Primary Examiner* — Michael Jung
(74) *Attorney, Agent, or Firm* — Stanzione & Kim, LLP

(57) ABSTRACT

A semiconductor device and a method of fabricating a semiconductor device. The semiconductor device includes an interlayer insulation layer pattern, a metal wire pattern exposed by a passage formed by a via hole formed in the interlayer insulation layer pattern to input and output an electrical signal, and a plated layer pattern directly contacting the metal wire pattern and filling the via hole. The method includes forming an interlayer insulation layer having a metal wire pattern to input and output an electrical signal formed therein, forming a via hole to define a passage that extends through the interlayer insulation layer until at least a part of the metal wire pattern is exposed, and forming a plated layer pattern to fill the via hole and to directly contact the metal wire pattern by using the metal wire pattern exposed through the via hole as a seed metal layer.

12 Claims, 11 Drawing Sheets

SEMICONDUCTOR DEVICE HAVING THROUGH SILICON VIA (TSV)

CROSS-REFERENCE TO RELATED APPLICATIONS

This application claims priority under 35 U.S.C. §119(a) from Korean Patent Application No. 10-2010-0046587, filed on May 18, 2010, in the Korean Intellectual Property Office, the disclosure of which is incorporated herein in its entirety by reference.

BACKGROUND OF THE INVENTION

1. Field of the Invention

The present general inventive concept relates to a semiconductor device and a method of fabricating the semiconductor device, and more particularly, to a semiconductor device including a through silicon via hole formed in a wafer level package and a method of fabricating the semiconductor device.

2. Description of the Related Art

The higher the integration of a semiconductor device, the greater a small defect of an element for forming the semiconductor device adversely affects an overall performance of the semiconductor device. For example, the higher the integration of a semiconductor device, the greater an aspect ratio of a through silicon via hole formed in a wafer level package, and thus there is a high possibility that a void may occur when filling a conductive material in the through silicon via hole. The void may adversely affect the overall performance of the semiconductor device.

Further, an attempt to reduce manufacturing costs of the semiconductor device currently an important goal in order to achieve quality competitiveness. For example, attempts to reduce the manufacturing costs of the semiconductor device have currently been made in the forming of the through silicon via holes formed in the wafer level package.

SUMMARY OF THE INVENTION

The inventive concept provides a semiconductor device including a through silicon via hole having no voids.

Additional features and advantages of the present general inventive concept will be set forth in part in the description which follows and, in part, will be obvious from the description, or may be learned by practice of the present general inventive concept.

The present general inventive concept provides a method of fabricating a semiconductor device including a through silicon via hole having no voids while reducing manufacturing costs of the semiconductor device.

According to a feature of the inventive concept, a semiconductor device includes an interlayer insulation layer pattern, a metal wire pattern exposed by a passage formed by a via hole, the passage extending through the interlayer insulation layer pattern to expose the metal wire pattern, and the metal wire pattern providing a path to input and/or output an electrical signal, and a plated layer pattern directly contacting the metal wire pattern and filling the passage formed by the via hole.

The plated layer pattern may be formed of metal according to an electroplating process in which the metal wire pattern functions as a seed metal layer.

The metal wire pattern and the plated layer pattern may be formed of copper.

The interlayer insulation layer pattern may include silicon, wherein the via hole is a through silicon via (TSV) hole to form the passage that exposes at least a portion of the metal wire pattern.

The semiconductor device may further include a conductive layer pattern formed on an inner sidewall of the interlayer insulation layer defined by the passage, and disposed between the interlayer insulation layer pattern and the plated layer pattern. The conductive layer pattern may be formed of metal according to a physical vapor deposition method. For example, the metal according to the physical vapor deposition method may include titanium.

According to another feature of the present general inventive concept, a semiconductor device includes an interlayer insulation layer pattern, a plated layer pattern filling a passage formed by a via hole and extending through the interlayer insulation layer pattern, and a seed metal layer disposed between the interlayer insulation layer pattern and the plated layer pattern, wherein the seed metal layer is formed only near a bottom of the passage formed by the via hole.

The seed metal layer may include a metal wire pattern exposed by the passage formed by the via hole formed in the interlayer insulation layer pattern, wherein the metal wire pattern provides a path to input and output an electrical signal.

The semiconductor device may further include a conductive layer pattern formed on an inner sidewall of the interlayer insulation layer and disposed between the interlayer insulation layer pattern and the plated layer pattern.

According to another feature of the inventive concept, a method of fabricating a semiconductor device includes forming an interlayer insulation layer having a metal wire pattern as a path to input and output an electrical signal buried therein, forming a via hole in the interlayer insulation layer to form a passage extending through the interlayer insulation layer until at least a portion of the metal wire pattern is exposed, and forming a plated layer pattern to fill the passage formed by the via hole, and directly contacting the metal wire pattern by using the metal wire pattern exposed through the passage as a seed metal layer.

The forming of the plated layer pattern may include filling the passage formed by the via hole starting from the metal wire pattern and increasing in a depth direction of the passage toward an outer surface of the interlayer insulation layer.

The method may further include, forming a conductive layer to cover the metal wire pattern, inner sidewalls of the interlayer insulation layer defined by the passage, and an outer surface of the interlayer insulation layer after the forming of the via hole and prior to the forming of the plated layer pattern, and removing the conductive layer formed on metal wire pattern so that the metal wire pattern is exposed through the passage formed by the via hole.

In the forming of the conductive layer, a thickness of the conductive layer formed on the outer surface of the interlayer insulation layer may be greater than that of the conductive layer formed on the metal wire pattern. For example, the conductive layer may include titanium according to a physical vapor deposition method.

The removing of the conductive layer may include removing the conductive layer formed on the metal wire pattern while maintaining the conductive layer formed on the inner sidewalls. For example, the removing of the conductive layer may include anisotropically etching the conductive layer using plasma.

According to another feature of the inventive concept a method of fabricating a semiconductor device includes forming a structure comprising a metal wire pattern as a path to input and output an electrical signal on a semiconductor substrate and an interlayer insulation layer to dispose the metal wire pattern, etching an entire surface of the semiconductor substrate from an upper portion thereof by a predetermined thickness after turning the structure over and onto an opposite surface, forming a passage extending through the semiconductor substrate and the interlay insulation pattern by sequentially etching a via hole through the upper surface of the remaining semiconductor substrate until the metal wire pattern is exposed; and forming a plated layer pattern to fill the passage formed by the via hole by using the metal wire pattern exposed through the passage as a seed metal layer.

The method may further include, forming a conductive layer to cover the metal wire pattern, inner sidewalls of the interlayer insulation layer defined by the passage, and an outer surface of the interlayer insulation layer after the forming of the via hole and prior to the forming of the plated layer pattern, and removing the conductive layer formed on metal wire pattern so that the metal wire pattern is exposed through the passage formed by the via hole.

The forming of the conductive layer may include using a physical vapor deposition method so that a thickness of the conductive layer formed on the surface outside the via hole is greater than that of the conductive layer formed on the metal wire pattern, and wherein the removing of the conductive layer comprises anisotropically etching the conductive layer formed on the metal wire pattern using plasma.

BRIEF DESCRIPTION OF THE DRAWINGS

Exemplary embodiments of the present general inventive concept will be more clearly understood from the following detailed description taken in conjunction with the accompanying drawings in which.

DETAILED DESCRIPTION OF THE PREFERRED EMBODIMENTS

Figure 1:
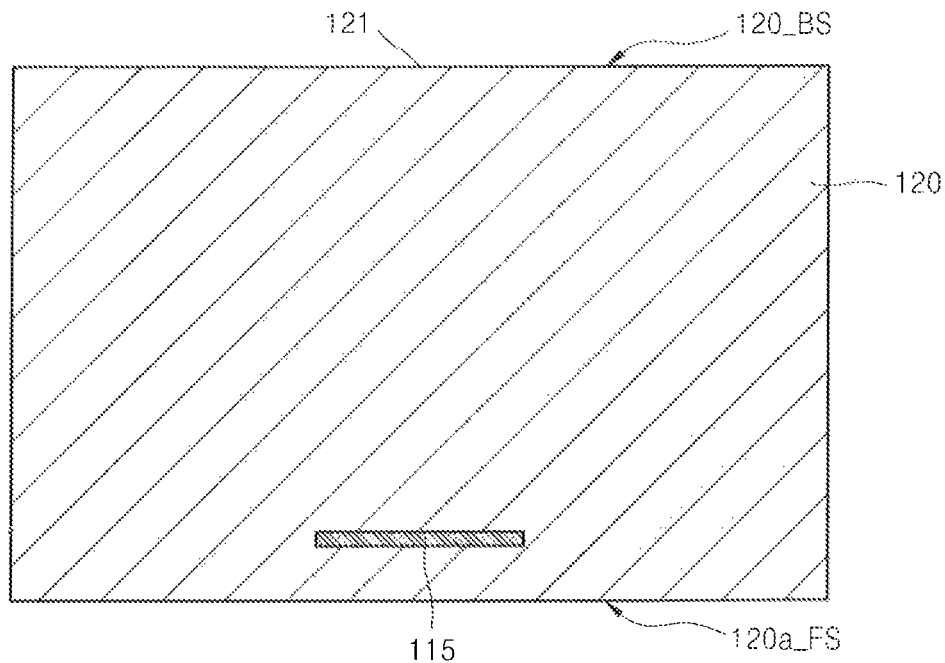
FIGS. 1 through 7 are cross-sectional views illustrating a method of fabricating a semiconductor device according to exemplary embodiments of the present inventive concept.

Reference will now be made in detail to exemplary embodiments of the present general inventive concept, examples of which are illustrated in the accompanying drawings. However, exemplary embodiments are not limited to the embodiments illustrated hereinafter, and the embodiments herein are rather introduced to provide easy and complete understanding of the scope and spirit of exemplary embodiments. In the drawings, the thicknesses of layers and regions are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

Additionally, it will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

In the present specification, the term "layer" is used to denote a part of a structure generated by deposited objects. Thus, the term "layer" may not be interpreted to have a meaning that is limited by the thicknesses of the objects.

Figure 7:
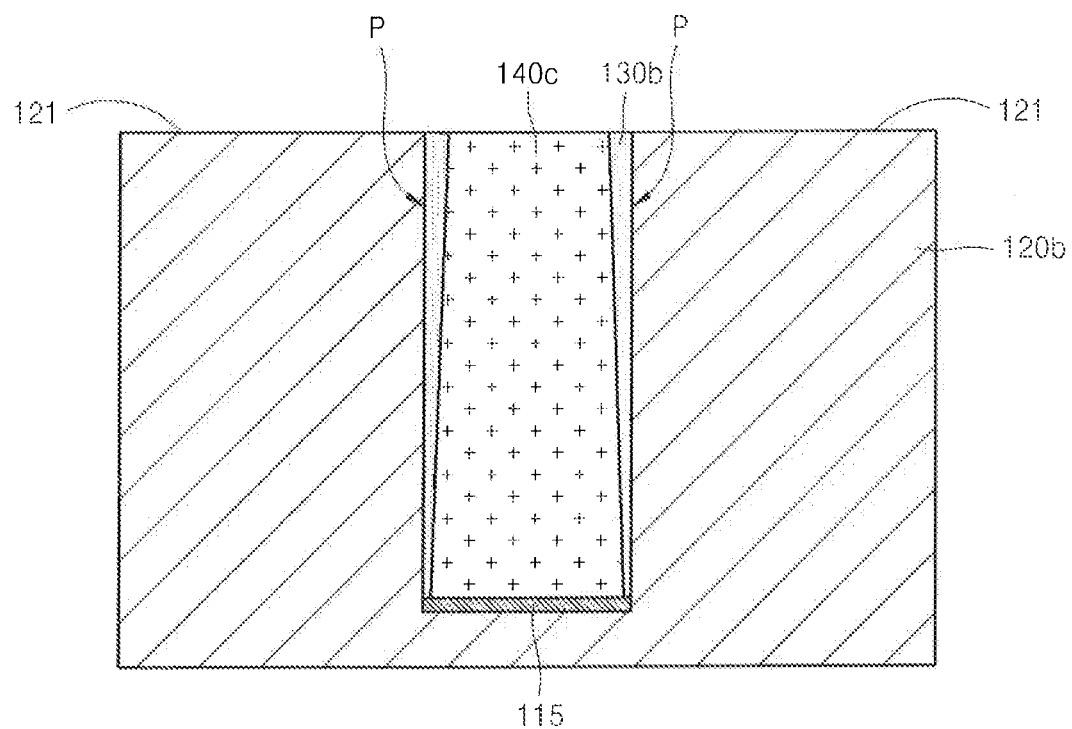

FIG. 7 is a cross-sectional view of a semiconductor device according to an exemplary embodiment of the present general inventive concept.

Referring to FIG. 7, the semiconductor device includes an interlayer insulation layer pattern 120*b*, and a metal wire pattern 115. The metal wire pattern 115 may be integrally formed with the interlayer insulation layer 120*b*. The metal wire pattern 115 may provide a path to input and/or output an electrical signal.

A via hole H is formed through an outer surface 121 of the interlayer insulation layer 120*b*. The via hole H forms a passage P that defines inner sidewalls 122 that extend from the outer surface 121 to the metal wire pattern 115. Accordingly, the metal wire pattern 115 may be exposed near a bottom of the passage P. Further, since the metal wire pattern 115 may be integrally formed with the interlayer insulation layer 120*b*, the inner sidewalls 122 do not extend past an upper surface of the metal wire pattern 115. As a result, a seal may be formed between inner sidewalls 122 and the metal wire pattern 115. A plated metal pattern 140*c* directly contacts the metal wire pattern 115 and fills the via hole H. The direct contact between the plated metal pattern 140*c* and the metal wire pattern 115 means that there is no layer disposed between the plated metal pattern 140*c* and the metal wire pattern 115.

The plated metal pattern 140*c* may be formed of a metal according to an electroplating process. The metal wire pattern 115 functions as a seed metal layer necessary to perform the electroplating process. If the plated metal pattern 140*c* is formed of copper, the seed metal layer contains copper.

Meanwhile, the seed metal layer (the metal wire pattern 115) is formed only near a bottom of the passage P formed by the via hole H. This means that the seed metal layer (the metal wire pattern 115) is not formed on the inner sidewalls defined by the passage P, and is not formed outside of the via hole H. Since the seed metal layer (the metal wire pattern 115) is formed only near the bottom of the passage P, the plated metal pattern 140c may be formed by filling the via hole H starting from the metal wire pattern 115 and extending in a height direction of the passage P toward the outer surface 121 during the electroplating process.

Figure 11:
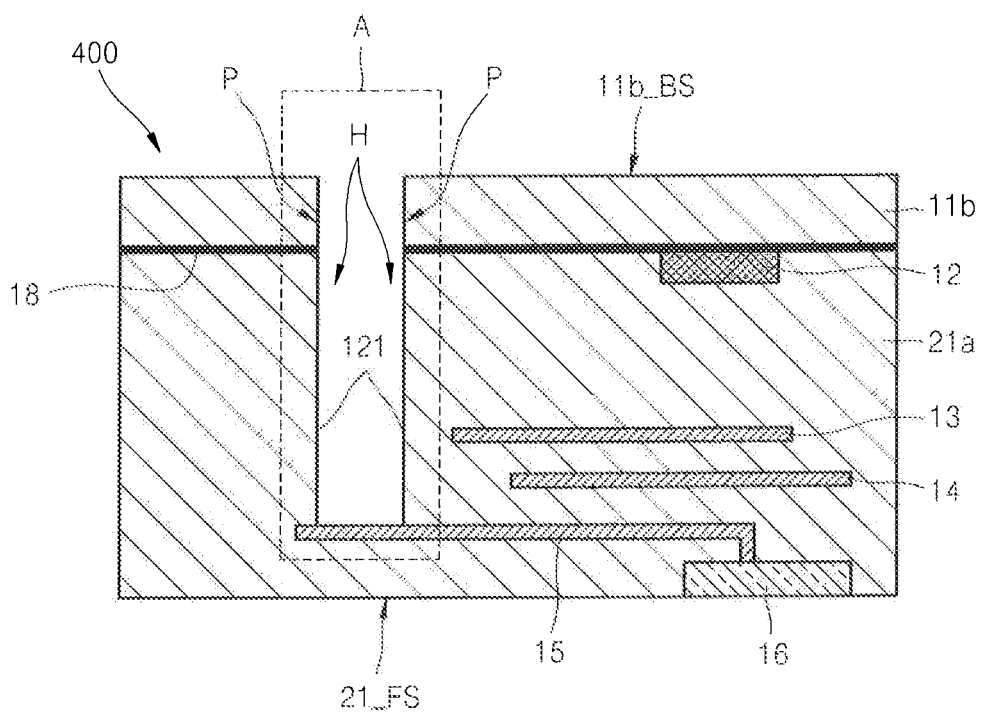

Meanwhile, although the seed metal layer (the metal wire pattern 115) is formed only near a bottom of the passage P formed by the via hole H with reference to FIG. 7, the present general inventive concept is not limited thereto. The seed metal layer (the metal wire pattern 115) may be formed in any of various ways as long as the metal wire pattern 115 is exposed only near a bottom of the passage P formed by the via hole H. For example, the metal wire pattern 115 may include at least one end that may further extend beyond the via hole H. For example, FIG. 11 shows a metal wire pattern 115 having an end 17 that extends to the left and beyond the via hole H. In addition, both ends of the metal wire pattern 115 may extend left and/or right beyond the passage P formed by the via hole H.

The metal wire pattern 115 may function as an electrical path that outputs and/or inputs an electrical signal from and/or to the semiconductor device. Although not shown, the metal wire pattern 115 may be disposed on upper sides of other elements (for example, a gate structure, a wordline structure, a bitline structure, and/or a capacitor structure) of the semiconductor device. The metal wire pattern 115 may be formed using various deposition methods including, but not limited to, a physical vapor deposition method and a chemical vapor deposition method. Additionally, the metal wire pattern 115 may be formed according to an electroplating process.

The interlayer insulation layer pattern 120b may include silicon. The interlayer insulation layer pattern 120b may be SiO$_2$ or SiON. The via hole H may be a through silicon via (TSV) hole formed through the interlayer insulation layer pattern 120b to define the passage P such that at least a portion of the metal wire pattern 115 is exposed. A conductive material may be flowed through the TSV hole to fill the passage P. The conductive material may be utilized as a core element to provide an electrical connection in, for example, a wafer level package.

A conductive layer pattern 130b may be formed on inner sidewalls 122 of the interlayer insulation pattern 120b. Further, the conductive layer pattern 130b may be disposed between the interlayer insulation layer pattern 120b and the plated metal pattern 140c. The conductive layer pattern 130b may function as a cathode to deliver current therethrough during the electroplating process. The conductive layer pattern 130b may also be formed of a metal according to a physical vapor deposition method. For example, the metal formed according to a physical vapor deposition method may include titanium.

FIGS. 1 through 7 are cross-sectional views illustrating a method of fabricating a semiconductor device according to an exemplary embodiment of the present general inventive concept.

Referring to FIG. 1, an interlayer insulation layer 120 is formed having the metal wire pattern 115. Accordingly, the metal wire pattern 115 may provide a path to input and/or output an electrical signal.

Figure 2:
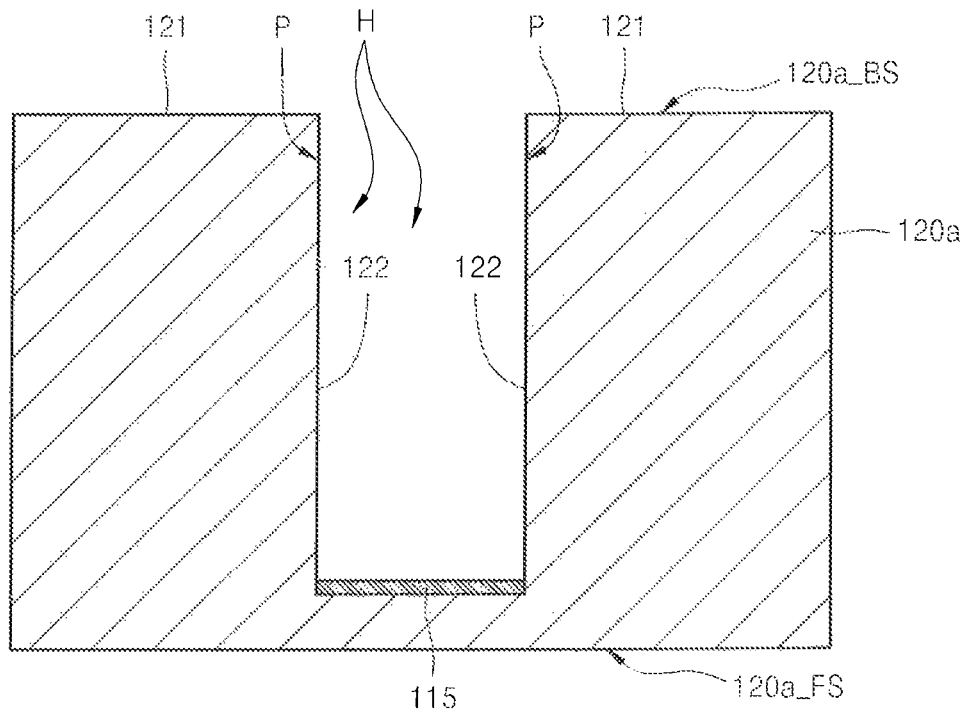

Referring to FIG. 2, an interlayer insulation layer pattern 120a (i.e., a resulting shape of the insulation layer 120 after forming the via hole H and passage P) having the via hole H is formed by etching the interlayer insulation layer 120 to form the passage P until a part of the metal wire pattern 115 is exposed. Accordingly, inner sidewalls 122 are formed extending from the outer surface 121 to the metal wire pattern 115. Thus, at least a portion of the metal wire pattern 115 is exposed by the via hole H. The metal wire pattern 115 may further extend left and/or right with respect to the passage P formed by the via hole H, as shown in FIG. 11 which is discussed in greater detail below.

Figure 3:
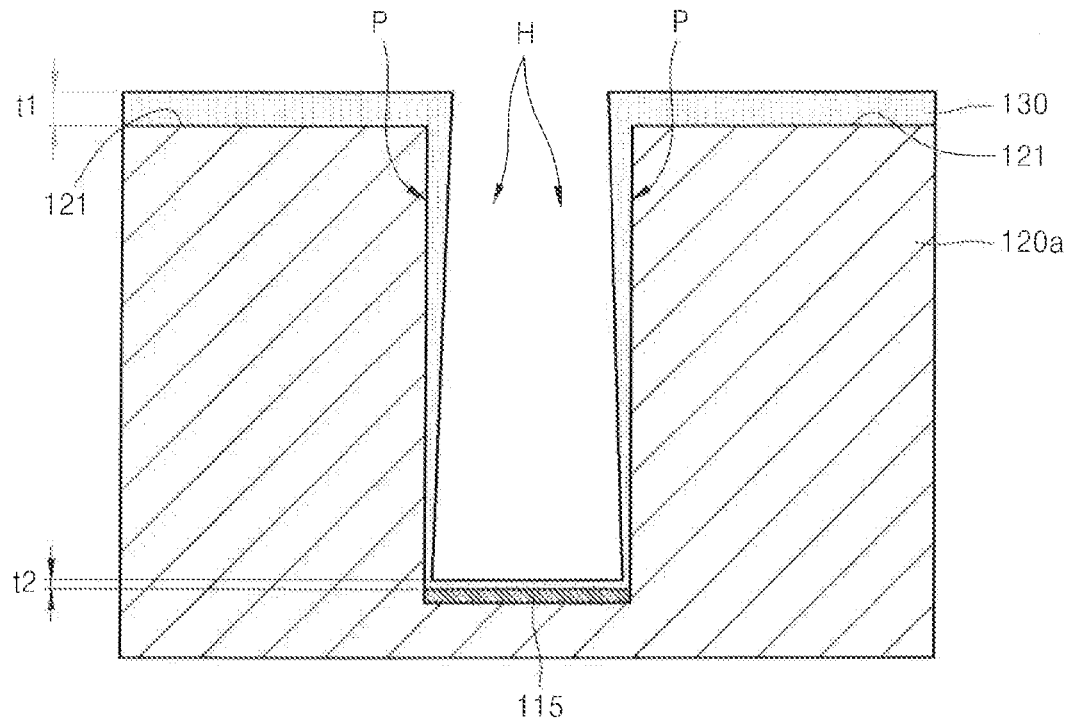

Referring to FIG. 3, a conductive layer 130 is formed entirely on the inner sidewalls 122 and the metal wire pattern 115. That is, the conductive layer 130 is formed to cover the metal wire pattern 115, and also entirely cover the inner sidewalls 122 and outer surface 121 of the interlaying insulation layer pattern 120a. The conductive layer 130 may function as a cathode to deliver current therefrom when performing an electroplating process in order to form a plated layer pattern during a subsequent process. A thickness t1 of the conductive layer 130 formed on the outer surface 121 of the interlaying insulation layer pattern 120a may be greater than a thickness t2 of the conductive layer 130 formed on the metal wire pattern 115. The conductive layer 130 may be formed using a physical vapor deposition method. For example, the conductive layer 130 may comprise titanium according to the physical vapor deposition method.

Figure 4:
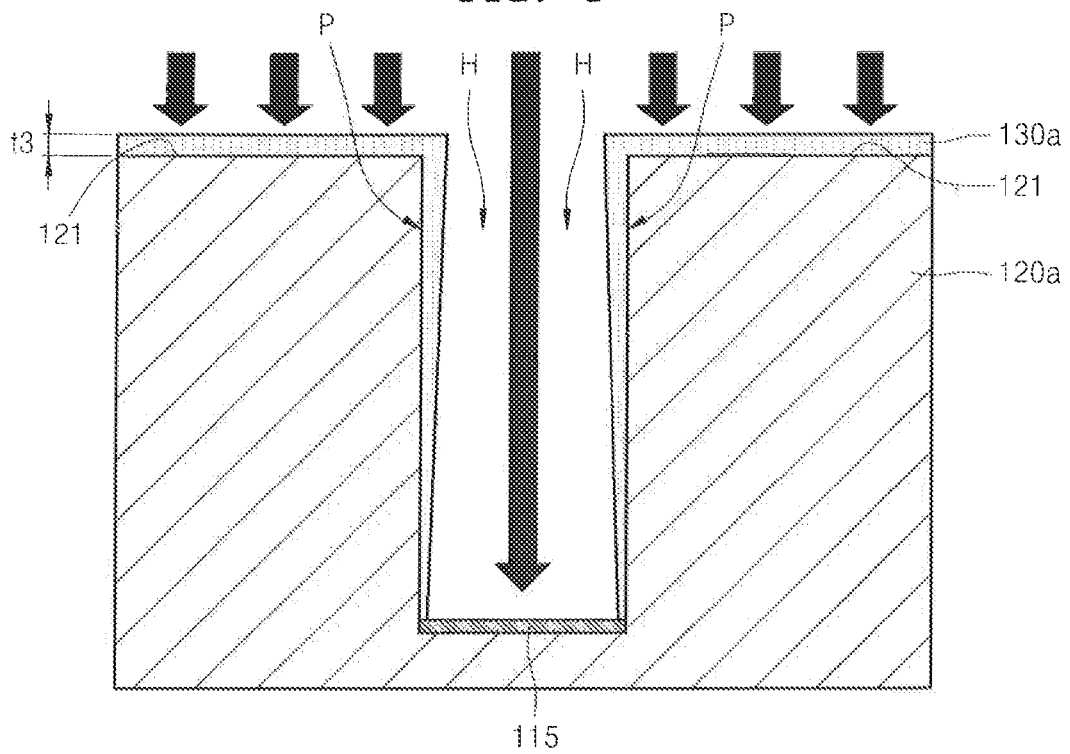

Referring to FIG. 4, the conductive layer 130 formed on the metal layer pattern 115 is removed so that the metal wire pattern 115 is exposed through the passage P formed by the via hole H. That is, the conductive layer 130 is formed directly on an upper surface of the metal wire pattern 115. While most of the metal wire pattern 115 is removed, the conductive layer 130 formed on the inner sidewalls 122 and the outer surface 121 of the interlaying insulation layer pattern 120a may not be completely removed, and thus may remain. For example, the conductive layer 130 formed on the outer surface 121 may not be completely removed and although the conductive layer 130 thereon remains, the thickness of the conductive layer 130 on the outer surface 121 is reduced (for example, from t1 to t3 as shown in FIGS. 3-4). This is because the conductive layer 130 functions as a cathode during an electroplating process in order to form the plated layer pattern 140c during a subsequent process, as mentioned above.

As described with reference to FIG. 3, since the thickness t1 of the conductive layer 130 formed on the outer surface 121 is greater than the thickness t2 of the conductive layer 130 formed on the metal wire pattern 115, the conductive layer 130 may be anisotropically etched in a etching depth direction (a thick arrow direction of FIG. 4) of starting from a via hole H formed at the outer surface 121, such that the conductive layer 130 formed on the metal wire pattern 115 may be completely removed while the conductive layer 130 formed on the inner sidewalls 122 and the outer surface 121 remain. Accordingly, a conductive layer pattern 130a shown in FIG. 4 may be realized. Further, a dry etching process using plasma may be used to perform the anisotropic etching.

Figure 5:
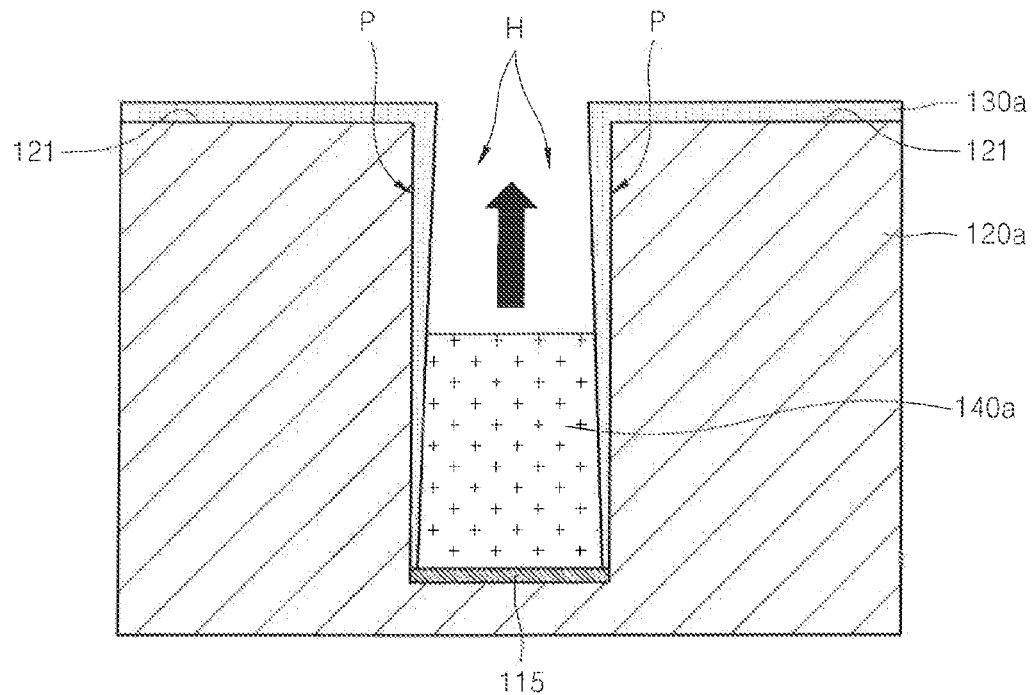

Referring to FIG. 5, the passage P formed by via hole H is filled with a plated layer pattern 140a. The plated layer pattern 140a directly contacts the metal wire pattern 115 and fills the passage P by using the metal wire pattern 115 as a seed metal layer. Thus, the plated layer pattern 140a within the passage P increases in a filling depth direction (i.e., a thick arrow direction shown in FIG. 5) toward the outer surface 121. Accordingly, the plated layer pattern 140a is stacked from a lower portion of the passage P to an upper portion of the passage P near the outer surface 121, thereby preventing a void from being generated in the upper portion of the passage P formed by the via hole H due to an overhang phenomenon.

Figure 6:
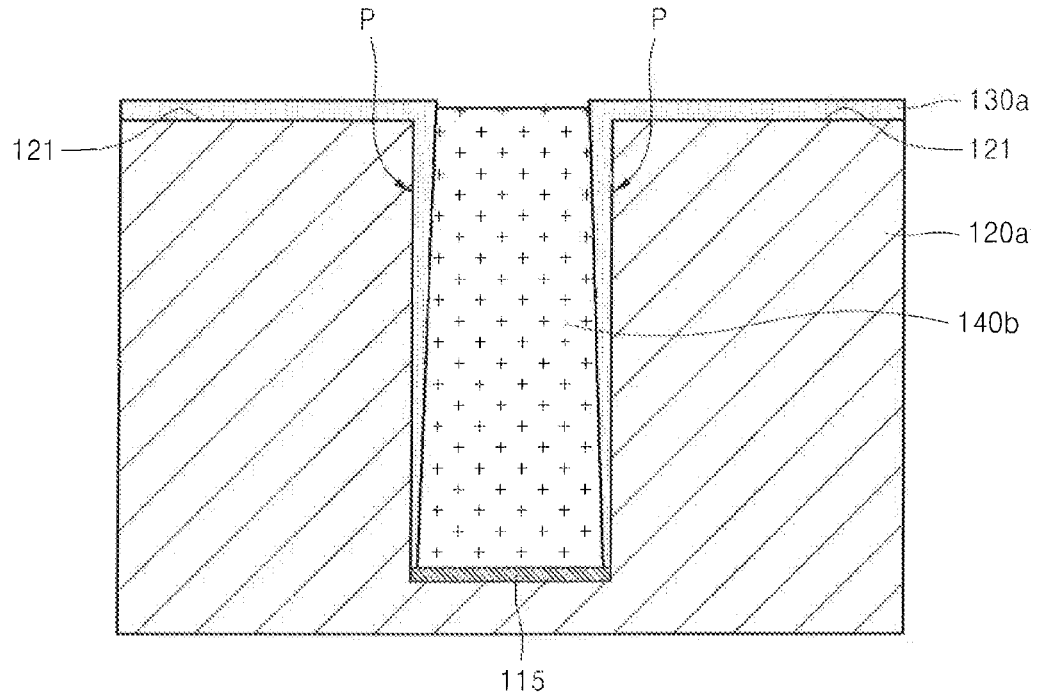

Referring to FIG. 6, a plated layer pattern 140b is formed by increasing the plated layer pattern 140a (see FIG. 6) until the plated layer pattern 140a reaches the outer surface 121 interlayer insulation layer pattern 120a and/or the conductive layer pattern 130a.

Referring to FIG. 7, the final structure of the interlayer insulation layer pattern 120b, the conductive layer pattern 130b, and the plated metal pattern 140c may be formed by etching the entire upper surface of the structure shown in FIG. 6, removing a part of the conductive layer pattern 130a and the plated layer pattern 140b, and flattening the conductive layer pattern 130a and the plated layer pattern 140b.

FIGS. 8 through 11 are cross-sectional views illustrating a method of fabricating a semiconductor device according to another exemplary embodiment of the present general inventive concept.

Figure 8:
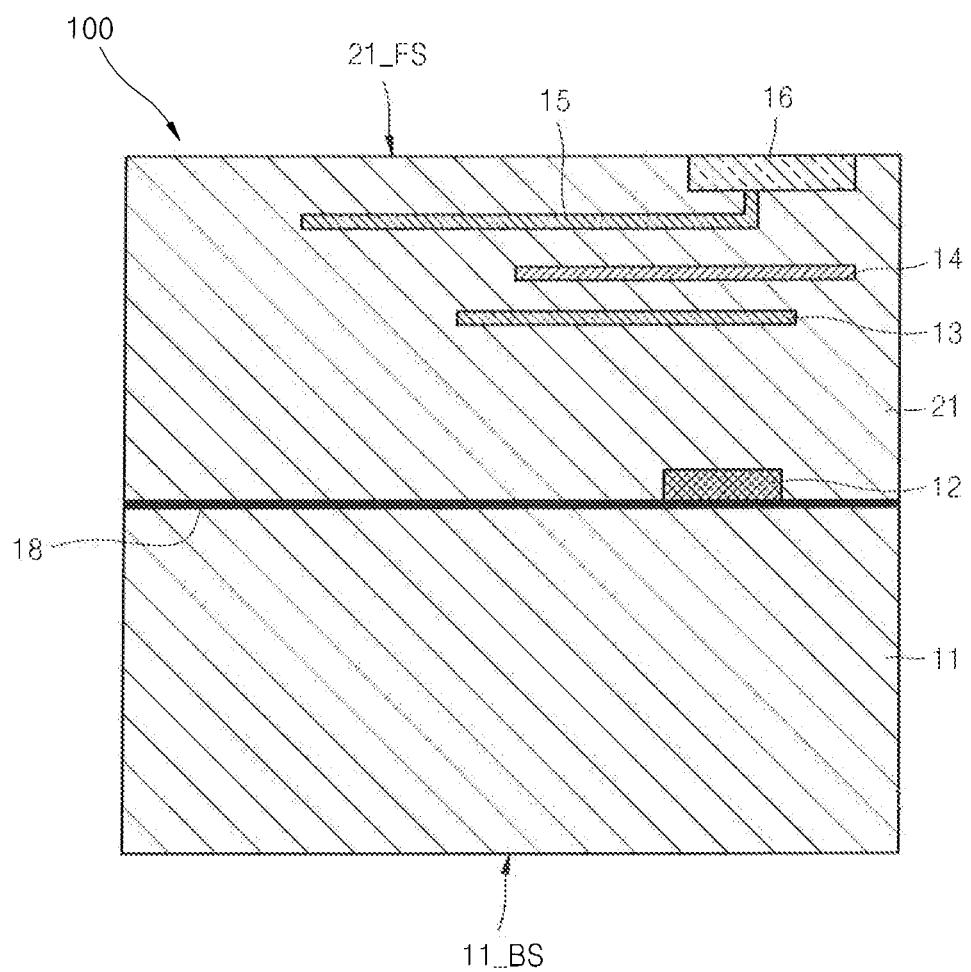
FIGS. 8 through 11 are cross-sectional views illustrating a method of fabricating a semiconductor device according other exemplary embodiments of the present general inventive concept.

Referring to FIG. 8, a first structure 100 includes a semiconductor substrate 11 and an insulation layer 21 formed thereto. The insulation layer 21 further includes metal wire patterns 13, 14, and 15 disposed therein. The metal wire patterns 13, 14 and 15 provide paths to input and/or output electrical signals therefrom on the semiconductor substrate 11. The interlayer insulation layer 21 may include silicon. The interlayer insulation layer 21 may be $SiO_2$ or SiON. The metal wire patterns 13, 14, and 15 may include first, second, and third metal wire patterns 13, 14, and 15 according to the locations thereof. Further, at least one of the metal wire patterns 13, 14 and 15 may be utilized as a seed metal layer to perform the electroplating process mentioned above. The metal wire patterns 13, 14, and 15 may be formed using at least one of a physical vapor deposition method and a chemical vapor deposition method. The metal wire patterns 13, 14, and 15 may be formed using an electroplating process. The metal wire pattern 15 may be connected to an electrical conductor including, but not limited to, an electrode pad 16. The electrode pad 16, for example, may be electrically connected to an external connection terminal (for example, a solder ball) in a wafer level package.

Meanwhile, a gate structure 12 may be disposed between the semiconductor substrate 11 and the metal wire patterns 13, 14, and 15. Although not shown, a bitline, a wordline, a capacitor structure, etc., may be further disposed between the semiconductor substrate 11 and the metal wire patterns 13, 14, and 15. Additionally, an intermediate layer 18 may be formed between the interlayer insulation layer 21 and the semiconductor substrate 11. Accordingly, the gate structure 12 may be disposed on the intermediate layer 18 such that the intermediate layer 18 electrically insulates the gate structure 12 from the semiconductor substrate 11. In another exemplary embodiment, a gate structure, a bitline, a wordline, a capacitor structure, etc, may be disposed in the semiconductor substrate 11.

Figure 9:
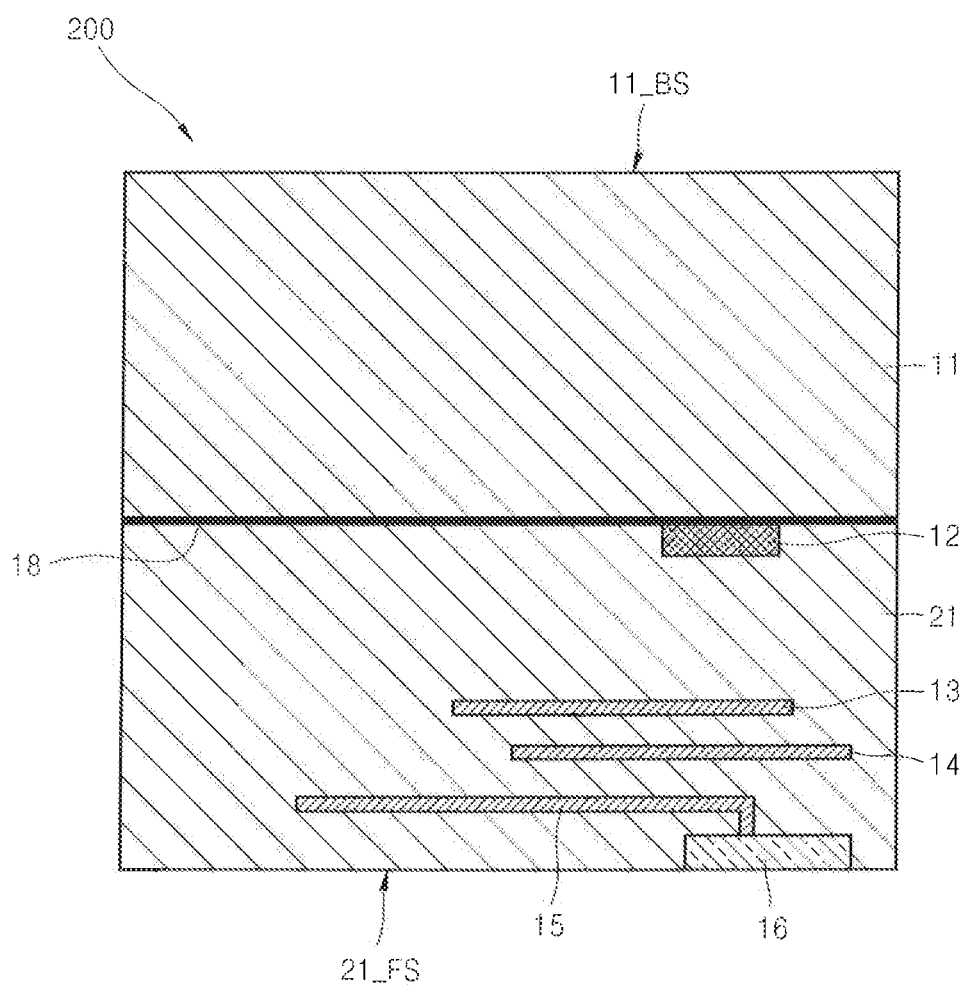

Referring to FIG. 9, a second structure 200 is prepared by performing a flipping process of turning the first structure 100 shown in FIG. 8 onto an opposite surface (i.e., flipping over the first structure 100 of FIG. 8). Thus, an upper surface 21_FS of the first structure 100 of FIG. 8 is a lower surface 21_FS of the second structure 200. Further, a lower surface 11_BS of the first structure 100 of FIG. 8 is an upper surface 11_FS of the second structure 200.

Figure 10:
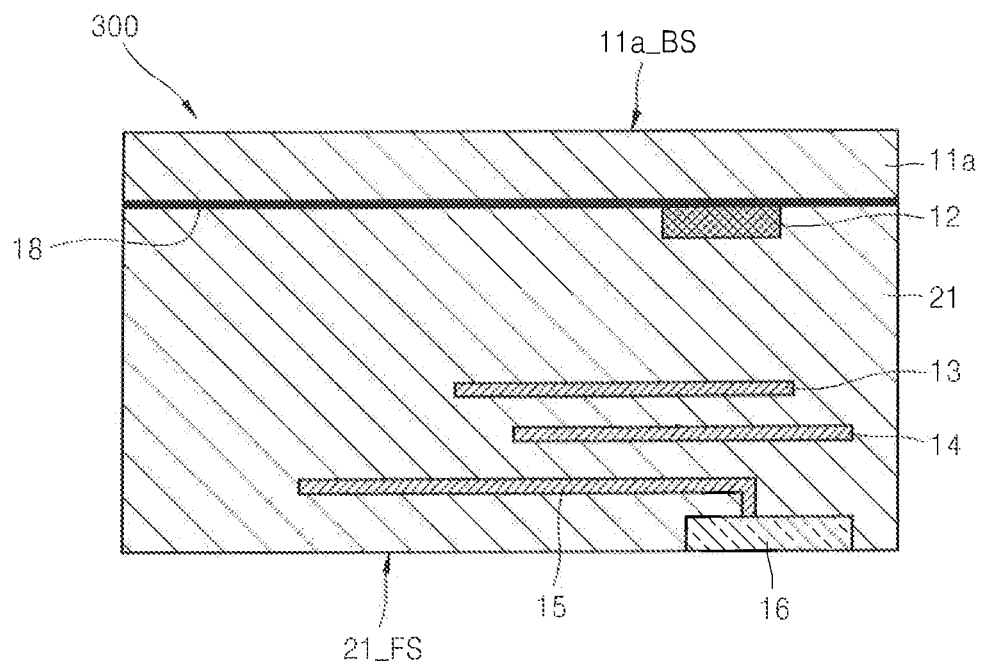

Referring to FIG. 10, a third structure 300 is formed by etching (for example, an etch-back process or a polishing process) the entire upper surface 11_BS of the second structure 200, i.e., the upper surface 11_BS of the semiconductor substrate 11 of FIG. 9, removing a part of the semiconductor substrate 11, and maintaining a remaining semiconductor substrate 11a.

Referring to FIG. 11, the via hole H is formed by sequentially etching the semiconductor substrate 11a and the interlayer insulation layer 21 from the upper surface 11a_BS of the third structure 300 to form the passage P that extends toward the metal wire pattern 15 until the metal wire pattern 15 is exposed, thereby providing a fourth structure 400. The metal wire pattern 15 exposed through the passage P formed by the via hole H may be electrically connected to the electrode pad 16.

A dotted portion A of FIG. 11 may correspond to the structure shown in FIG. 2.

Thus, an upper surface 120a_BS of the structure of FIG. 2 may correspond to the upper surface 11b_SS of the structure of FIG. 11, and a lower surface 120a_TS of the structure of FIG. 2 may correspond to the upper surface 21_FS of the structure of FIG. 11. The interlayer insulation layer pattern 120a of FIG. 2 may correspond to a semiconductor substrate 11b and an interlayer insulation layer 21a of FIG. 11. The metal wire pattern 115 of FIG. 2 may correspond to the metal wire pattern 15 of FIG. 11.

FIGS. 12 through 15 are cross-sectional views illustrating a method of fabricating a semiconductor device, as compared to the methods of fabricating a semiconductor device according to exemplary embodiments of the present general inventive concept illustrated in FIGS. 1 through 11.

Figure 12:
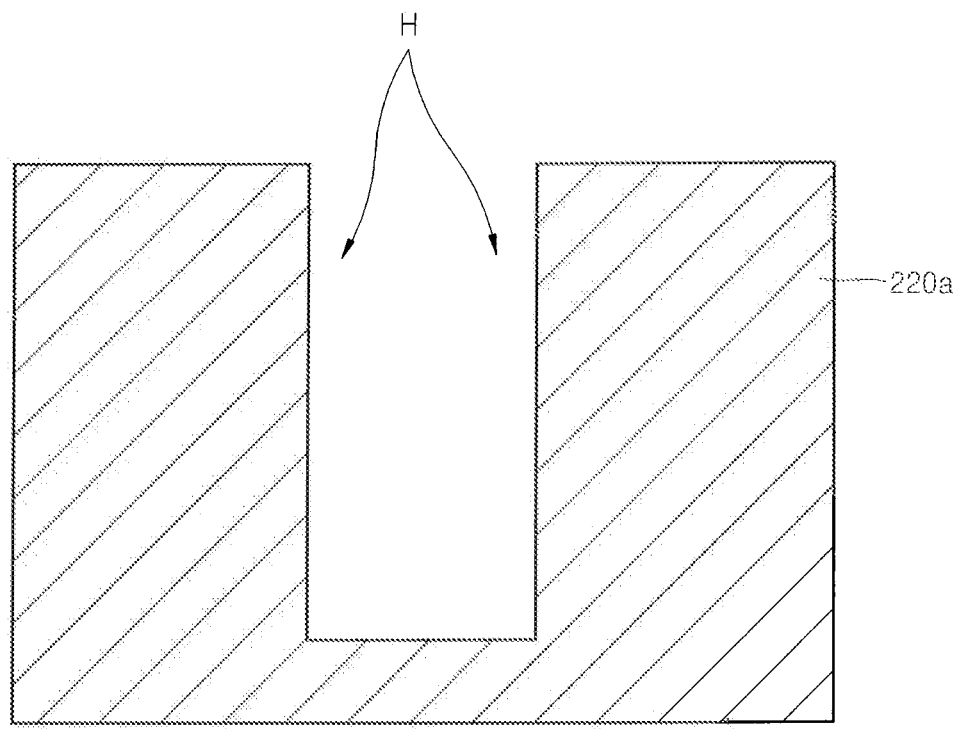
FIGS. 12 through 15 are cross-sectional views illustrating a method of fabricating a semiconductor device to be compared with the methods of fabricating a semiconductor device of FIGS. 1 through 11.

Referring to FIG. 12, an interlay insulation layer pattern 220a including the via hole H is prepared. Unlike the structures according to the present general inventive concept, since a metal wire pattern is not initially included, a seed metal layer must be added after forming the via hole H such that the via hole H can be filled with a plated layer pattern 260 according to an electroplating process. That is, since the interlay insulation pattern 220a of FIG. 12 does not provide an integrally formed seed layer, a separate seed layer must be supplied after forming a via hole H.

Figure 13:
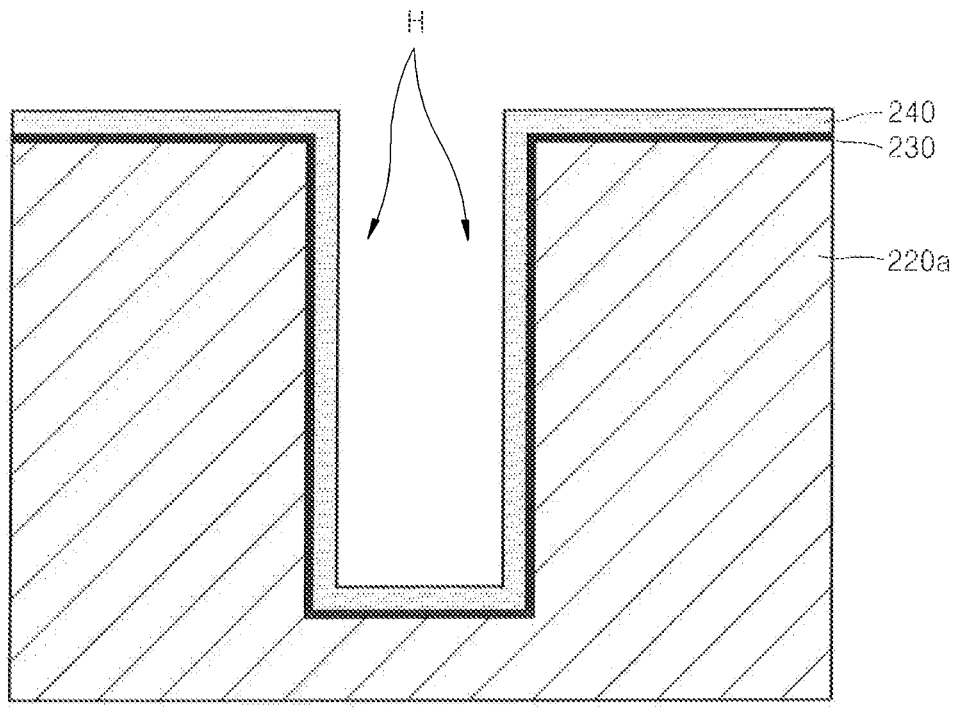

Referring to FIG. 13, a seed metal layer 240 is formed on entire surfaces of the structure of FIG. 12. A conductive layer 230 may be disposed between the interlayer insulation layer 220a and the seed metal layer 240.

Figure 14:
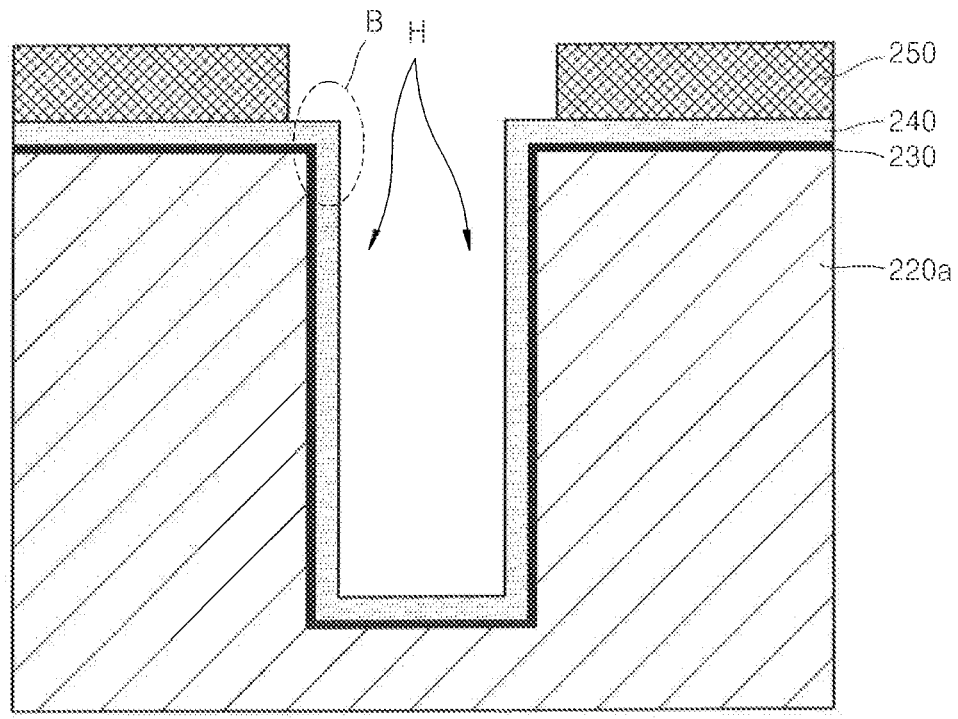

Referring to FIG. 14, a photoresist layer pattern 250 is formed near the via hole H while exposing the via hole H. A process of forming the photoresist layer pattern 250 near the via hole H is accompanied by a photolithography process, which increases the manufacturing costs of the semiconductor device. In the present general inventive concept, the photolithography process is not needed to fill the via hole H, thereby reducing the manufacturing cost.

Figure 15:
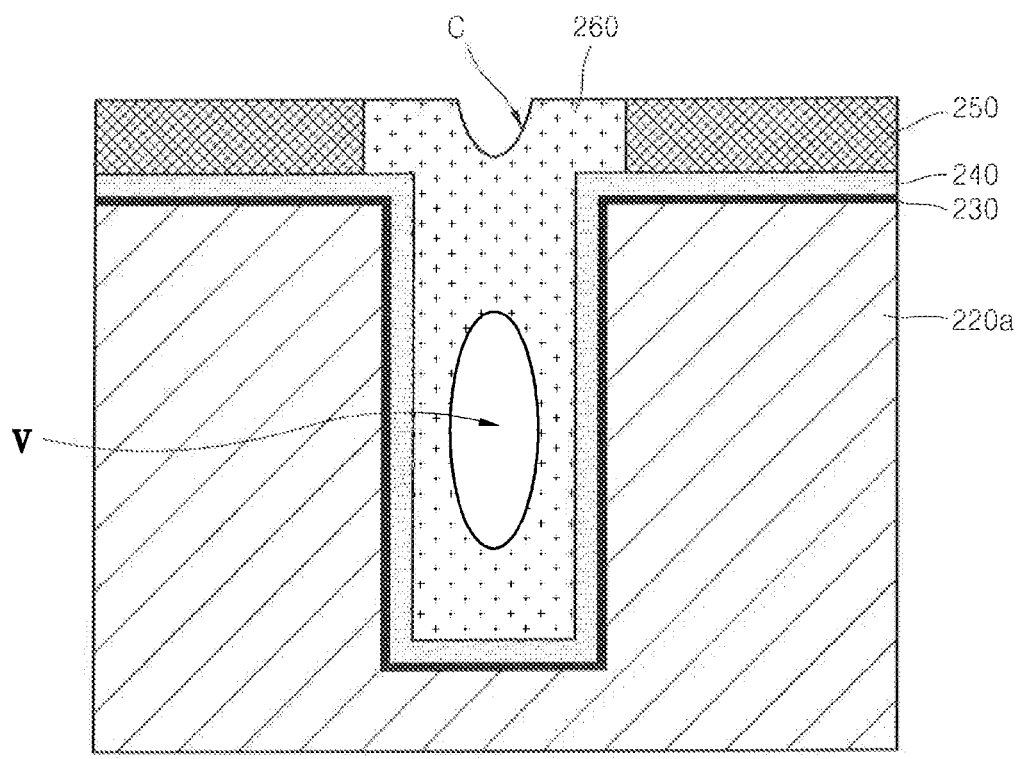

Referring to FIG. 15, a plated layer pattern 260 is formed on the seed metal layer 240 exposed by the photoresist layer pattern 250 according to an electroplating process. However, since the seed metal layer 240 is disposed near a bottom of the via hole H and the side surface thereof after the via hole H is formed, the plated layer pattern 260 is formed according to an isotropic plating growth, and thus there is a high possibility that a void V is generated in the plated layer pattern 260. Further, since a current is concentrated in the seed metal layer 240 formed in an upper corner (B of FIG. 14) of the via hole H during an electroplating process, the plated layer pattern 260 is overgrown in the upper corner of the via hole H, and thus an overhang phenomenon occurs. Thus, there is a high possibility that the void V is generated in the plated layer pattern 260. A concave surface C may be formed in an upper surface of the plated layer pattern 260 by reflecting the shape of the via hole H.

Such problems may be fundamentally solved in the present general inventive concept since a seed metal layer may be integrally formed with an interlayer insulation layer only near a bottom of the via hole H. In the present general inventive concept, a seed metal layer is not separately formed and a metal wire pattern is used, thereby reducing the manufacturing cost.

While the present general inventive concept has been particularly shown and described with reference to exemplary embodiments thereof, it will be understood that various changes in form and details may be made therein without departing from the spirit and scope of the following claims.

What is claimed is:

1. A semiconductor device comprising:
   an interlayer insulation layer pattern;
   a metal wire pattern exposed by a passage extending from a via hole formed through the interlayer insulation layer pattern, the metal layer pattern forming a path to input and output an electrical signal;
   a plated layer pattern directly contacting the metal wire pattern and filling the via hole, the plated layer pattern formed according to an electroplating process with the metal wire pattern as a seed metal layer of the electroplating process; and
   a conductive layer pattern formed so as to completely cover an inner sidewall of the interlayer insulation layer pattern defined by the passage and disposed between the interlayer insulation layer pattern and the plated layer pattern,
   wherein a thickness of the conductive layer pattern is reduced from an upper part of the inner sidewall to a lower part of the inner sidewall.

2. The semiconductor device of claim 1, wherein a portion of the exposed metal wire pattern is formed near a bottom of the passage.

3. The semiconductor device of claim 1, wherein the metal wire pattern and the plated layer pattern are formed of copper.

4. The semiconductor device of claim 1, wherein the via hole is a through silicon via (TSV) hole to form the passage that exposes at least a portion of the metal wire pattern.

5. The semiconductor device of claim 4, wherein the metal wire pattern is electrically connected to an electrode pad of a wafer level package.

6. The semiconductor device of claim 1, wherein the conductive layer pattern is formed of a metal including titanium.

7. A semiconductor device comprising:
   an interlayer insulation layer pattern;
   a plated layer pattern filling a passage formed by a via hole, the passage extending through the interlayer insulation layer pattern;
   a seed metal layer disposed between the interlayer insulation layer pattern and the plated layer pattern, the seed metal layer including a metal wire pattern exposed by the passage formed in the interlayer insulation layer pattern, the metal wire pattern forming a path to input and output an electrical signal; and
   a conductive layer pattern formed so as to completely cover an inner sidewall interlayer insulation layer pattern defined by the passage and disposed between the interlayer insulation layer pattern and the plated layer pattern,
   wherein the seed metal layer is formed only at a bottom of the passage,
   wherein the plated layer pattern is formed according to an electroplating process with the seed metal layer, and
   wherein a thickness of the conductive layer pattern is reduced from an upper part of the inner sidewall to a lower part of the inner sidewall.

8. The semiconductor device of claim 7, further comprising a conductive layer pattern formed on an inner sidewall interlayer insulation layer pattern defined by the passage, wherein the conductive layer pattern is disposed between the interlayer insulation layer pattern and the plated layer pattern.

9. A semiconductor device including an interlayer insulation layer, comprising:
   an electrically conductive seed layer that is a metal wire pattern that is integrally formed in the interlayer insulation layer;
   a passage formed through the interlayer insulation layer that defines inner sidewalls of the interlayer insulation layer and exposes the electrically conductive seed layer;
   a conductive layer that completely covers the inner sidewalls of the interlayer insulation layer; and
   a plated layer pattern that is formed according to an electroplating process with the electrically conductive seed layer and that fills the passage and directly contacts the conductive layer and the electrically conductive seed layer,
   wherein a thickness of the conductive layer is reduced from an upper part of the inner sidewalls to a lower part of the inner sidewalls.

10. The semiconductor device of claim 9, further comprising:
    a semiconductor substrate formed against the interlayer insulation layer; and
    a plurality of metal wire patterns integrally formed in the interlayer insulation layer to input and output electrical signals therefrom,
    wherein the plurality of metal wire patterns includes the electrically conductive seed layer.

11. The semiconductor device of claim 10, further comprising:
    a gate structure formed in the interlayer insulation layer between the semiconductor substrate and the plurality of metal wire patterns; and
    an electrical conductor contacting the electrically conductive seed layer.

12. The semiconductor device of claim 9, wherein the integrally formed electrically conductive seed layer includes an end portion that extends beyond the inner sidewalls defined by the passage.

* * * * *